(12) United States Patent
Takeshita et al.

(10) Patent No.: US 6,459,109 B2
(45) Date of Patent: Oct. 1, 2002

(54) SEMICONDUCTOR POSITION SENSOR

(75) Inventors: Tatsuo Takeshita, Hamamatsu (JP); Masayuki Sakakibara, Hamamatsu (JP); Kouji Noda, Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 0 days.

(21) Appl. No.: 09/749,736

(22) Filed: Dec. 28, 2000

Related U.S. Application Data

(63) Continuation-in-part of application No. PCT/JP99/03445, filed on Jun. 28, 1999.

(30) Foreign Application Priority Data

Jun. 30, 1998 (JP) .............................. 10-184643
Mar. 17, 1999 (JP) .............................. 11-072005

(51) Int. Cl.$^7$ .............................................. H01L 31/078
(52) U.S. Cl. ........................................ 257/290; 257/465
(58) Field of Search ................................. 257/290, 465

(56) References Cited

U.S. PATENT DOCUMENTS 4,877,951 A * 10/1989 Muro ........................... 257/290
4,887,140 A * 12/1989 Wang .......................... 257/465
5,561,287 A * 10/1996 Turner et al. ................ 257/290

FOREIGN PATENT DOCUMENTS

| JP | 64-36088 | 2/1989 |
| JP | 1-289178 | 11/1989 |
| JP | 2-246168 | 10/1990 |
| JP | 4-10581 | 1/1992 |
| JP | 4-313279 | 11/1992 |
| JP | 5-13808 | 1/1993 |

* cited by examiner

*Primary Examiner*—Gene M. Munson
(74) *Attorney, Agent, or Firm*—Morgan, Lewis & Bockius LLP

(57) ABSTRACT

A semiconductor position sensor functions as a PSD or as a two-part split PD or the like, based on control of disconnection/connection of basic, electroconductive strips by controlling a voltage of gate electrode. This semiconductor position sensor does not require a PD separate from the PSD, whereby the device itself can be constructed in compact size. Further, since all signal light can impinge on a photosensitive area, detection sensitivity can be improved.

11 Claims, 5 Drawing Sheets

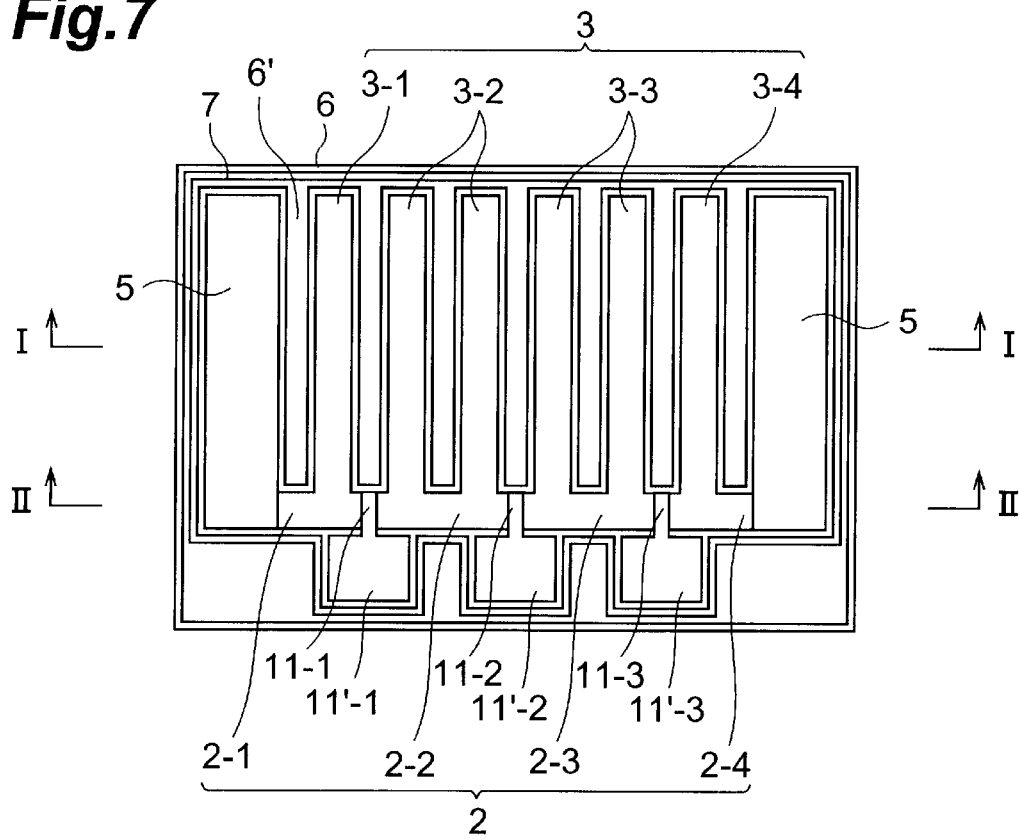
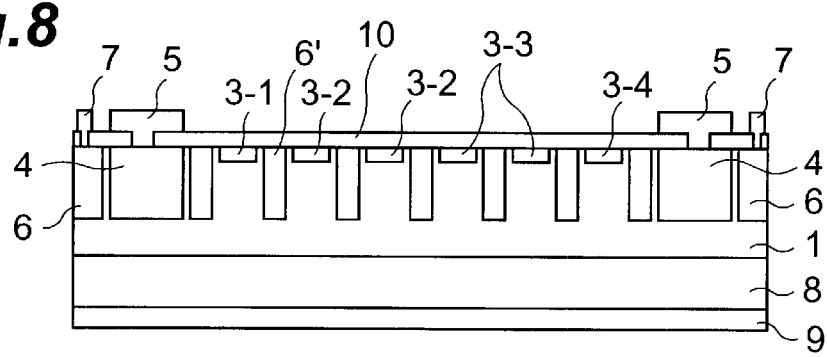
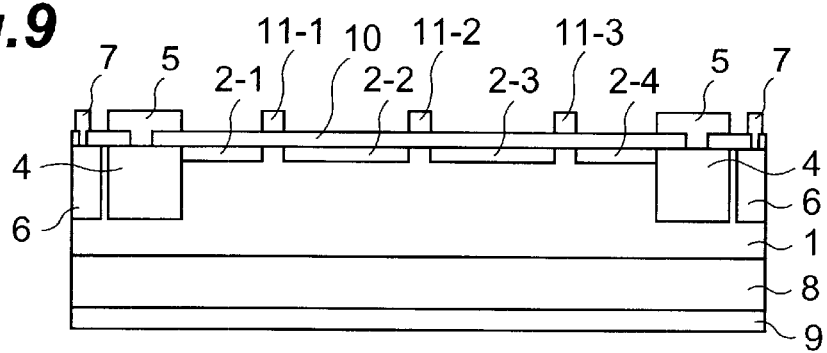

SEMICONDUCTOR POSITION SENSOR

RELATED APPLICATION

This is a continuation-in-part application of application Ser. No. PCT/JP99/03445 filed on Jun. 28, 1999, now pending.

BACKGROUND OF THE INVENTION

1. Field of the Invention

The present invention relates to a semiconductor position sensor.

2. Related Background Art

Position sensitive detectors (PSDs) are known as devices for measuring the distance to an object to be measured, by the principle of so-called triangulation or the like. The PSDs are mounted as distance-measuring devices of the active type on imaging devices, and in such imaging devices focusing of a taking lens is carried out based on the distance to the object, measured by PSD.

The PSDs can provide continuous output according to positions of incidence light, but their S/N ratios become heavily lowered under circumstances of low intensity of signal light, e.g., in measurement of far range. For this reason, it is impossible to improve the ranging accuracy for measurement in the far range in the distance-measuring systems using the PSDs. In contrast with it, multiple-part split photodiodes such as two-part split photodiodes (PDs) are unable to provide continuous output according to positions of incidence, different from the PSDS, but are able to demonstrate higher detection sensitivity, because there occurs little deterioration of S/N ratios even with a low intensity of signal light.

Then, Japanese Patent Application Laid-Open No. H04-313279 describes a semiconductor optical position sensor in the form of combination of PSD with two-part split PD.

FIG. 14 is a top view of such a semiconductor position sensor. This position sensor is provided with the PSD consisting of a layer having a semiconductor-conductive-strip-forming region 20 provided on a semiconductor substrate 1 and a pair of signal output electrodes 5 provided at two ends of the region 20, and with the two-part split PD 21 located on the far range side where the intensity of signal light is low. In this position sensor, the PSD provides continuous output according to positions of incidence of signal light, while the two-part split PD performs position detection with good sensitivity at the positions where the signal light is weak.

SUMMARY OF THE INVENTION

In this structure, however, the chip area is large and, because light impinges on the PSD and a separation portion of the two-part split PD, only part of the signal light is utilized for the position detection and it is thus impossible to enhance the detection sensitivity where the spot size of the illuminating signal light is small. The present invention has been accomplished in view of this problem and an object thereof is to provide a semiconductor position sensor that is smaller than those of the conventional technology and that can achieve improvement in the detection sensitivity.

In order to solve the above problem, a semiconductor position sensor according to the present invention is a semiconductor position sensor in which electric currents outputted from two ends of a semiconductor electroconductive area vary according to positions of incident light on a photosensitive area, wherein gate means capable of interrupting electric conduction between the two ends is provided on an intermediate area of the layer of the semiconductor conductive area. The semiconductor position sensor functions as a Psd when the gate means enables electric conduction between the two ends of the semiconductor conductive area, but functions as a multiple-part split or single PD when the gate means interrupts the electric conduction between them.

It is preferable that the gate means comprise an insulating film laid on the semiconductor, and a gate electrode laid on the insulating film. A channel formed immediately below the gate electrode through the insulating film is controlled by a voltage applied to the gate electrode. This channel disappears when the voltage of the gate electrode reaches a predetermined value. Then the electric conduction is interrupted between the two ends of the layer of the semiconductor conductive area.

In order to efficiently collect charge generated according to incidence light to the photosensitive area, toward the semiconductor conductive area, it is preferable that the semiconductor position sensor of the present invention comprises a layer having a plurality of electroconductive branching strips extending from the semiconductor conductive strips.

For reducing influence of the branching strips on the detection accuracy, it is desirable to set an impurity concentration thereof high, so as to decrease the resistivity. However, if the resistivity of the branching strips is substantially equal to that of the semiconductor conductive area, they can be fabricated in the same step, whereby the production time can be reduced.

In the semiconductor position sensor of the present invention, it is preferable that the semiconductor conductive strip immediately below the gate electrode have an impurity concentration different from that of the two ends, whereby the impurity concentration of this area permits one to set the gate voltage necessary for generation of the channel.

The gate means may comprise an insulating film laid on the semiconductor conductive strip, and a plurality of gate electrodes laid each on the insulating film. In this case, the ratio of areas of respective photodiode zones of the multi-part split photodiode can be made variable.

The present invention will be more fully understood from the detailed description given hereinbelow and the accompanying drawings, which are given byway of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWING

FIG. 7 is a top view of the semiconductor position sensor according to the third embodiment.

FIG. 8 is a cross-sectional view along I—I and in the arrow direction of the semiconductor position sensor illustrated in FIG. 7.

FIG. 9 is a cross-sectional view along II—II and in the arrow direction of the semiconductor position sensors illustrated in FIG. 7.

DESCRIPTION OF THE PREFERRED EMBODIMENT

The semiconductor position sensors of embodiments will be described hereinafter. The same elements or elements having the same functions will be denoted by the same reference symbols, and redundant description will be omitted.

(First Embodiment)

Figure 1:
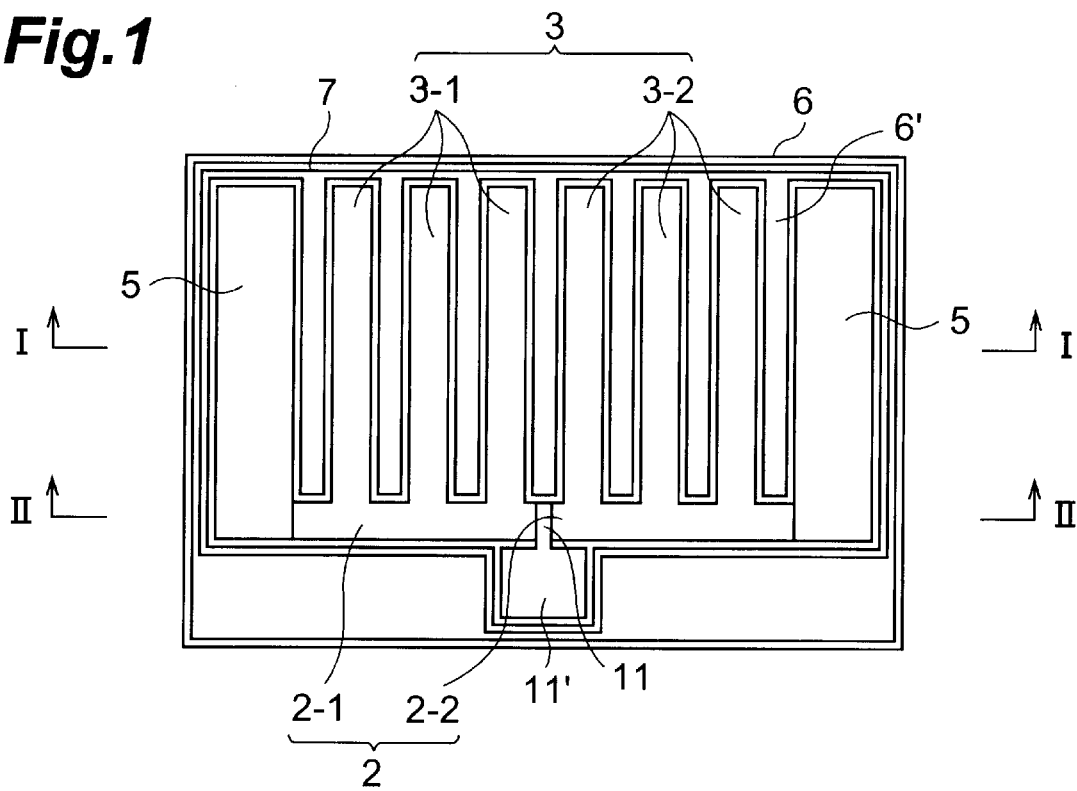
FIG. 1 is a top view of the semiconductor position sensor according to the first embodiment.
Figure 2:
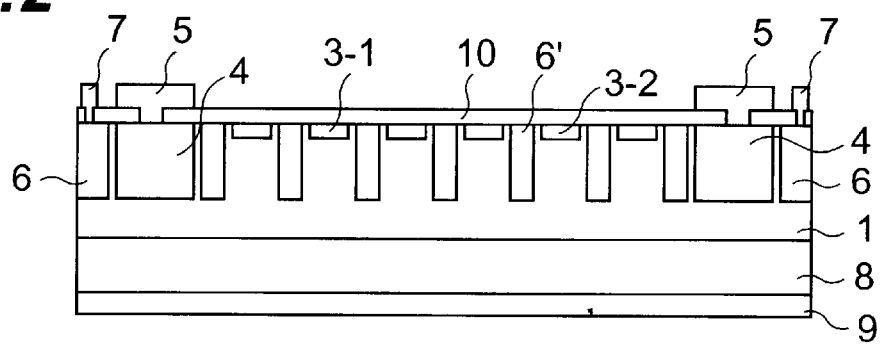
FIG. 2 is a cross-sectional view along I—I and in the arrow direction of the semiconductor position sensor illustrated in FIG. 1.
Figure 3:
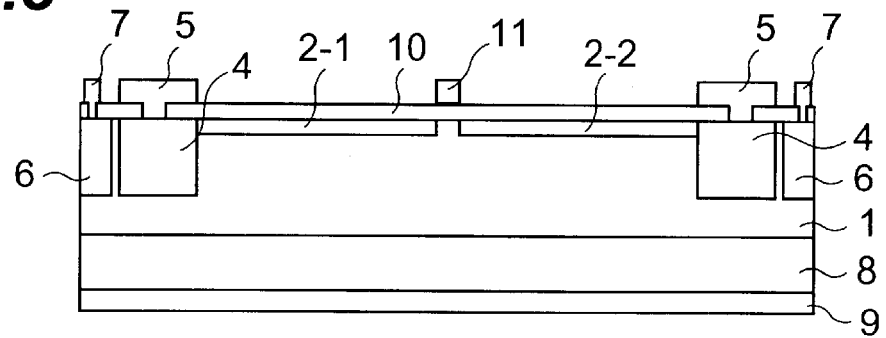
FIG. 3 is a cross-sectional view along II—II and in the arrow direction of the semiconductor position sensor illustrated in FIG. 1.

FIG. 1 is a top view of the semiconductor position sensor according to the first embodiment, FIG. 2 is across-sectional view along I—I and in the arrow direction of the semiconductor position sensor illustrated in FIG. 1, and FIG. 3 a cross-sectional view along II—II and in the arrow direction of the semiconductor position sensor illustrated in FIG. 1.

The semiconductor position sensor of the present embodiment is provided with a semiconductor substrate 1 of n-type Si of a low impurity concentration and a back n-type semiconductor layer 8 of n-type Si of a high impurity concentration formed on the back surface of the semiconductor substrate 1. The surface of the semiconductor substrate 1 is rectangular. In the following description, the length direction (longitudinal direction) X is the extending direction of the longer sides of the rectangular surface of the n-type semiconductor substrate 1, the width direction Y is the extending direction of the shorter sides, and th depth direction (thickness direction) Z is the extending direction perpendicular to both the length direction X and width direction Y. Namely, the directions X, Y, and Z are orthogonal to each other.

The present semiconductor position sensor has a layer having a basic, electroconductive area/strip 2 consisting of two electroconductive strips 2-1, 2-2 formed in the semiconductor substrate 1 and extending in line along the length direction X. The basic, conductive strip 2 is made of p-type Si. The basic, conductive strip 2 is formed in the n-type semiconductor substrate 1. Each basic, conductive strip 2-1, 2-2 has a separation portion at the border thereof, and the interior of each layer 2-1, 2-2 is continuous along the length direction X without intervention of an insertion area. Resistive areas forming the basic, conductive strip 2 have a substantially equal impurity concentration, i.e., resistivity ρ along the X-direction, and extend substantially to the same depth along the thickness direction from the surface of the n-type semiconductor substrate 1.

The semiconductor position sensor is provided with a pair of signal output electrodes 5 which are formed at the two ends of the surface of the semiconductor position sensor and from which output currents are taken out from the two ends of the basic, conductive strip 2.

The semiconductor position sensor has the layer including electroconductive branching strips 3 consisting of a plurality of electroconductive strips 3-1, 3-2 each extending along the photosensitive area from the basic, conductive strips 2-1, 2-2. An impurity concentration of the branching strips 3 is substantially equal to that of the basic, conductive strip 2 and the length along the width direction Y of the branching strips 3 is longer than the diameter of the incident light spot.

The branching strips 3 may also be made of p-type Si of a high impurity concentration. In this case, each basic, conductive strip 2-1, 2-2 is formed so that a plurality of p-type resistive areas are continuous along the length direction x through one-end portions of the branching strips of the different impurity concentration, the impurity concentration of the branching strips 3 is higher than that of the basic, conductive strip 2, and the resistivity of the branching strips 3 is lower than that of the basic, conductive strip 2.

The semiconductor position sensor has a pair of high impurity concentration signal output semiconductor layers 4 which are connected respectively to the both ends of the basic, conductive strip 2 and which are formed in the semiconductor substrate 1. The high impurity concentration signal output semiconductor layers 4 are made of p-type Si of a high impurity concentration. The semiconductor layers 4 extend along the thickness direction Z from the surface of the semiconductor substrate 1 down to the position deeper than the depth of the basic, conductive strip 2.

The semiconductor position sensor has an enclosure semiconductor layer 6 formed in the outer periphery of the rectangular surface of the semiconductor substrate 1. The enclosure semiconductor layer 6 is made of n-type Si of a high impurity concentration. The enclosure semiconductor layer 6 is formed in the □-shape in the marginal region of the rectangular surface of the semiconductor substrate 1, surrounds the substrate surface region in which the basic, conductive strip 2, branching strips 3, and the semiconductor layers 4 are formed, and extends along the depth direction Z from the surface of the n-type semiconductor substrate 1 down to a predetermined depth.

The semiconductor position sensor is provided with semiconductor layers 6' for isolation of the branching strips, which are formed in the semiconductor substrate 1. The semiconductor layers 6' for isolation of the branching strips are made of n-type Si of a high impurity concentration. The semiconductor layers 6' consist of a plurality of n-type branching strips extending along the width direction Y from the inside of one longer side of the □-shaped enclosure semiconductor layer 6 toward the basic, conductive strip 2. Each branching strip extends along the thickness direction Z from the surface of the n-type semiconductor substrate 1 down to a predetermined depth. The n-type branching strips are deeper than the p-type branching strips 3 and are interposed between the branching strips 3 and between the branching strips 3 and the semiconductor layers 4 to electrically isolate them from each other. Namely, the branching strips prevent an electric current from flowing along the length direction X between adjacent branching strips 3 and between the branching strips 3 and the semiconductor layers 4.

The semiconductor position sensor is equipped with a passivation film (insulating film) 10 covering the rectangular surface of the semiconductor substrate 1. It is noted that illustration of the passivation film 10 is omitted in FIG. 1 and in the top views of the semiconductor position sensors according to the following embodiments. The passivation film 10 has a pair of rectangular apertures for the signal output electrodes at the both ends in the length direction and a □-shaped aperture for enclosure electrode in the outer periphery. The passivation film 10 is made of $SiO_2$. The signal output electrodes 5 are formed on the respective semiconductor layers 4 through the pair of respective apertures for the signal output electrodes in the passivation film 10 and are in ohmic contact with the semiconductor layers 4. The surface shape of the signal output electrodes 5 is the same as that of the semiconductor layers 4.

The semiconductor position sensor has an enclosure electrode 7 formed on the n-type enclosure semiconductor layer 6 through the aperture for enclosure electrode in the passivation film 10. The enclosure electrode 7 is in ohmic contact with the enclosure semiconductor layer 6. The enclosure electrode 7 prevents light from entering the outer periphery of the semiconductor substrate 1. A predetermined voltage can be placed between the enclosure electrode 7 and the signal output electrodes 5.

The semiconductor position sensor has a back electrode 9 formed on the bottom surface of the back n-type semiconductor layer 8. The back electrode 9 is used as an ohmic contact for the back n-type semiconductor layer 8.

The semiconductor position sensor is provided with a gate electrode 11 on the passivation film (insulating film) 10 on the border between the basic, conductive strips 2-1, 2-2. The gate electrode 11 is electrically connected to a bonding pad 11' on the passivation film 10 and forms a channel in the portion corresponding to the basic, conductive strip 2 (the surface area of the semiconductor substrate 1), which is the separation portion immediately below the gate electrode 11, when a predetermined voltage is given through the bonding pad 11' to the gate electrode 11. When a negative voltage is given to the gate electrode 11, positive charge gathers here. Thus the conduction type of the channel is the p-type and the semiconductor position sensor functions as a PSD.

When the zero or a positive voltage is given to the gate electrode 11 on the other hand, the p-type channel disappears, so as to interrupt electric conduction between the basic, conductive strips 2-1, 2-2, i.e., between the two ends of the basic, conductive strip 2, and the semiconductor position sensor functions as a two-part split PD.

When the semiconductor position sensor functions as a PSD and when the incident light falls on the photosensitive area, defined by the surface area of the n-type semiconductor substrate 1 with the branching strips 3 formed therein, in a state in which such a voltage as to apply a reverse bias voltage to pn junction diodes composed of the p-type branching strips 3 and the n-type semiconductor substrate 1 is applied between the pair of signal output electrodes 5 and the bottom electrode 9, electron-hole pairs (charge) are generated according to the incident light inside the semiconductor position sensor to diffuse and either electrons or holes flow into the branching strips 3 according to the electric field inside the semiconductor position sensor. This charge is conducted in the branching strips 3 to flow to predetermined positions of the basic, conductive strip 2 and the charge is distributed in amounts inversely proportional to resistances to the both ends of the basic, conducive layer 2 according to the positions in the length direction X of the basic, conductive strip 2. The charge thus distributed is extracted each through the both ends of the basic, conductive strip 2 from the respective signal output electrodes 5.

When the semiconductor position sensor functions as a two-part split PD on the other hand and when the incident light falls on the photosensitive area in a state in which such a voltage as to apply the reverse bias voltage to the pn junction diodes composed of the p-type branching strips 3 and the n-type semiconductor substrate 1 is applied between the pair of signal output electrodes 5 and the bottom electrode 9, electron-hole pairs (charge) are generated according to the incident light inside the semiconductor position sensor to diffuse and either electrons or holes flow through the branching strips 3 into the basic, conductive strips 2-1, 2-2 in a ratio according to the incident position in accordance with the electric field inside the semiconductor position sensor. The charge distributed in this way is extracted each through the both ends of the basic, conductive strip 2 from the respective signal output electrodes 5.

As described above, the semiconductor position sensor of the present embodiment is the semiconductor position sensor wherein the electric currents outputted from the two ends of the semiconductor conductive strip 2 vary according to the positions of the incident light on the photosensitive area, and the sensor is provided with the gate means 10, 11 capable of interrupting the electric conduction between the two ends in the intermediate area of the semiconductor conductive strip 2. The semiconductor position sensor functions as a PSD when the gate means enables the electric conduction between the two ends of the semiconductor conductive strip 2, but functions as a multi-part split PD when the gate means interrupts the electric conduction between them. Therefore, the present embodiment does not have to include a multi-part split PD separate from the PSD, and thus the device itself can be constructed in compact size. Since the whole incident light can impinge on the photosensitive area, the detection sensitivity can be improved.

This gate means consists of a partial area of the insulating film 10 placed on the semiconductor conductive strip 2 and the gate electrode 11 placed on this insulating film. The channel formed immediately below the gate electrode 11 through the insulating film 10 is controlled by the voltage applied to the gate electrode 11. This channel disappears when the voltage of the gate electrode 11 reaches the predetermined value, whereby the electric conduction is interrupted between the two ends of the semiconductor conductive strip 2.

In order to weaken the influence of the branching strips 3 on the detection accuracy, it is preferable to set the impurity concentration thereof high and the resistivity low; in the present embodiment, however, the resistivity of the branching strips 3 is substantially equal to that of the semiconductor conductive strip 2 and thus they are produced in the same step, so as to decrease the production time.

(Second Embodiment)

Figure 4:
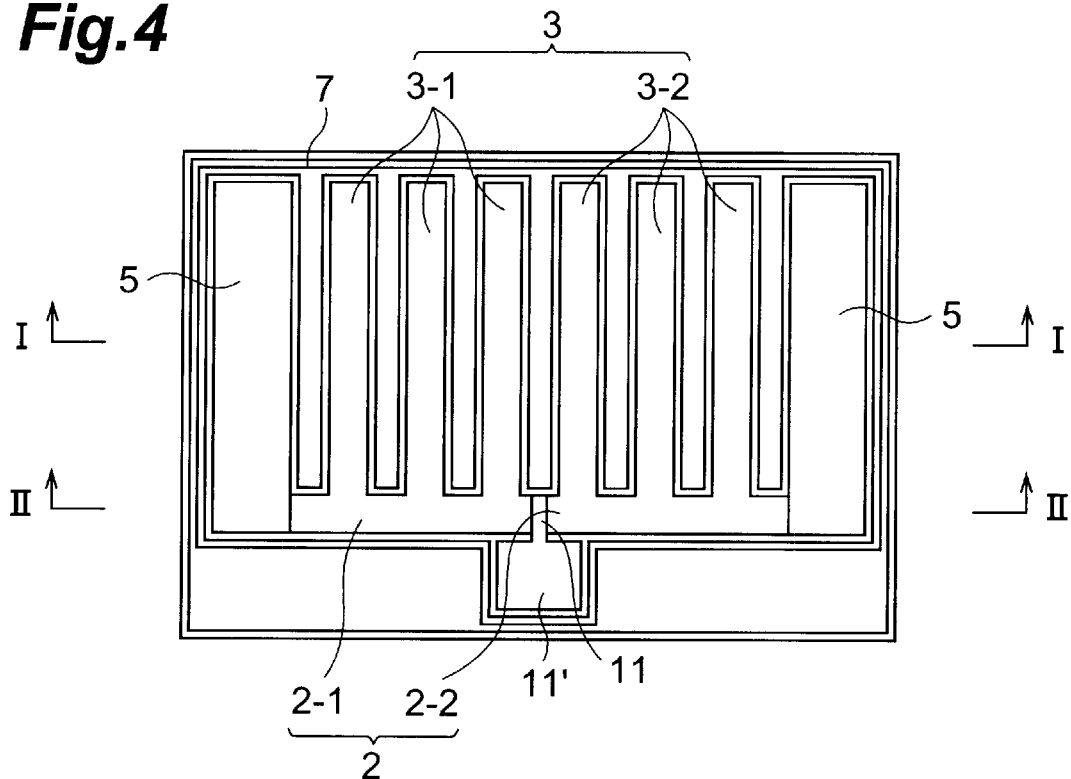
FIG. 4 is a top view of the semiconductor position sensor according to the second embodiment.
Figure 5:
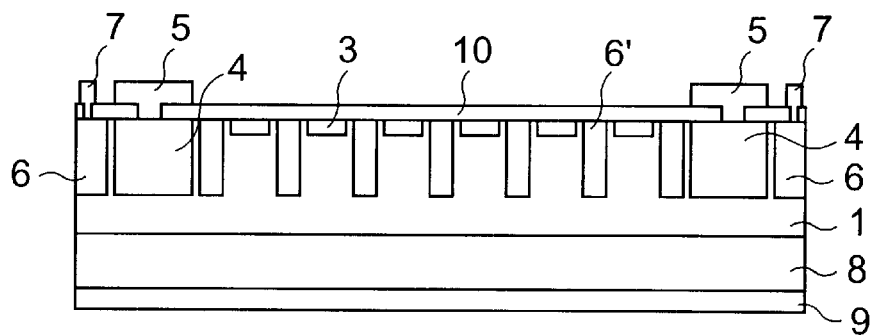
FIG. 5 is a cross-sectional view along I—I and in the arrow direction of the semiconductor position sensor illustrated in FIG. 4.
Figure 6:
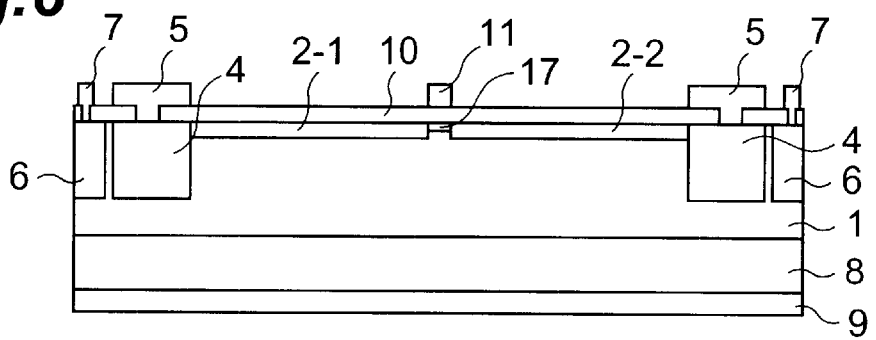
FIG. 6 is a cross-sectional view along II—II and in the arrow direction of the semiconductor position sensor illustrated in FIG. 4.

FIG. 4 is a top view of the semiconductor position sensor of the second embodiment, FIG. 5 is a cross-sectional view along I—I and in the arrow direction of the semiconductor position sensor illustrated in FIG. 4, and FIG. 6 a cross-sectional view along II—II and in the arrow direction of the semiconductor position sensor illustrated in FIG. 4.

The semiconductor position sensor of the present embodiment is different from that of the first embodiment only in that the sensor further includes a semiconductor layer 17 for adjustment of the channel-forming potential, which connects the basic, conductive strips 2-1, 2-2, in the surface region of the semiconductor substrate 1 immediately below the gate electrode 11, i.e., in the separation portion between the basic, conductive strips 2-1, 2-2. The semiconductor layer 17 has the same conduction type as that of the basic, conductive strips 2-1, 2-2 and is the p-type in the present embodiment. When the zero or a negative voltage relative to the cathode is given to the gate electrode 11, the semiconductor layer 17 remains in the p-type and the semiconductor position sensor functions as a PSD. When a positive voltage is given to the gate electrode 11, an n-type channel to cancel the conduction type of the p-type semiconductor 17 is created in the semiconductor layer 17, so as to electrically isolate the basic, conductive strips 2-1, 2-2 from each other, and thus the semiconductor position sensor functions as a two-part split PD.

Namely, in the present semiconductor position sensor, the semiconductor conductive strip 17 immediately below the gate electrode 11 has an impurity concentration different from that of the two ends thereof and the gate potential necessary for the generation of channel can be determined by the impurity concentration of this area.

(Third Embodiment)

FIG. 7 is a top view of the semiconductor position sensor of the third embodiment, FIG. 8 is a cross-sectional view along I—I and in the arrow direction of the semiconductor position sensor illustrated in FIG. 7, and FIG. 9 a cross-sectional view along II—II and in the arrow direction of the semiconductor position sensor illustrated in FIG. 7.

The semiconductor position sensor of the present embodiment is different from that of the first embodiment only in that the basic, conductive strip 2 is separated into four conductive strips 2-1, 2-2, 2-3, 2-4 and a plurality of gate electrodes 11-1, 11-2, 11-3 and bonding pads 11-1', 11-2', 11-3'are provided on respective separation portions. Namely, in the present embodiment, the aforementioned gate means includes the insulating film 10 placed on the semiconductor conductive strip 2 and the plurality of gate electrode zones 11-1, 11-2, 11-3 placed each on the insulating film. In the present embodiment, the ratio of areas of the respective photodiode zones of the multi-part split PD can be made variable by controlling the voltage applied to the gate electrodes 11-1, 11-2, 11-3 so as to control disconnection/connection states of the separation portions. It is noted that the semiconductor position sensor of the present embodiment may also be provided with the semiconductor layers 17 as described in the second embodiment.

(Fourth Embodiment)

Figure 10:
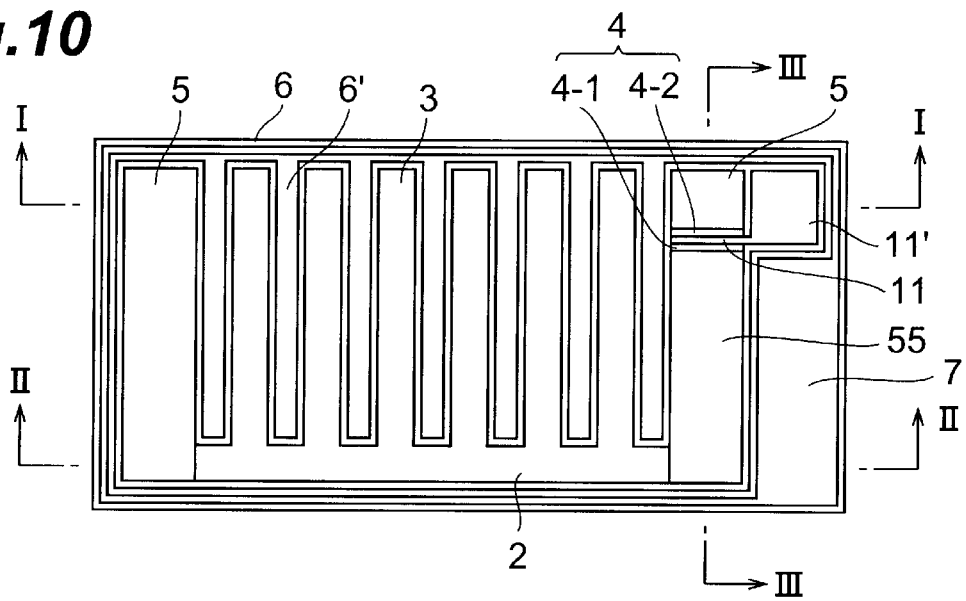
FIG. 10 is a top view of the semiconductor position sensor according to the fourth embodiment.
Figure 11:
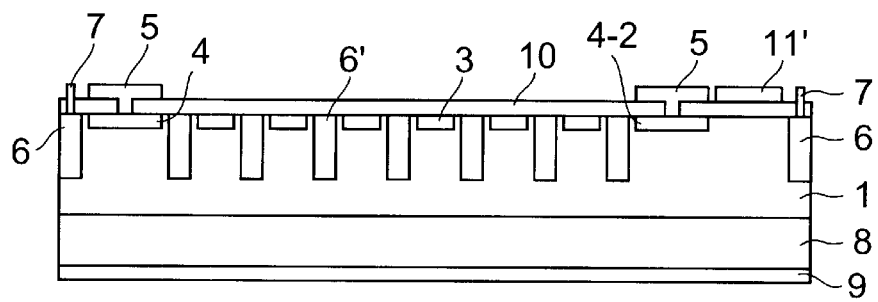
FIG. 11 is a cross-sectional view along I—I and in the arrow direction of the semiconductor position sensor illustrated in FIG. 10.
Figure 12:
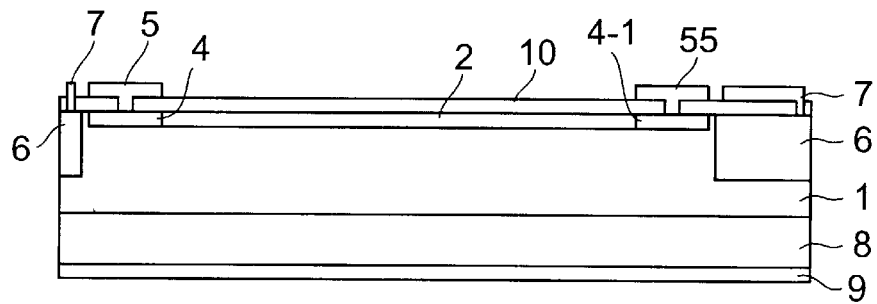
FIG. 12 is a cross-sectional view along II—II and in the arrow direction of the semiconductor position sensor illustrated in FIG. 10.
Figure 13:
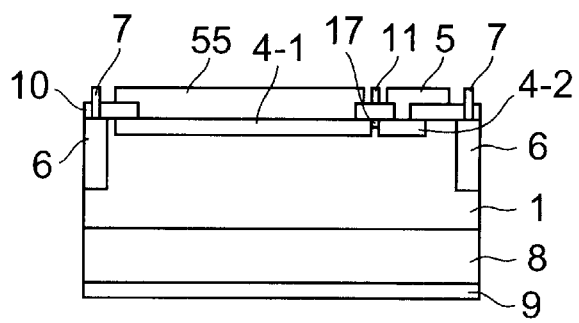
FIG. 13 is a cross-sectional view along III—III and in the arrow direction of the semiconductor position sensor illustrated in FIG. 10.
Figure 14:
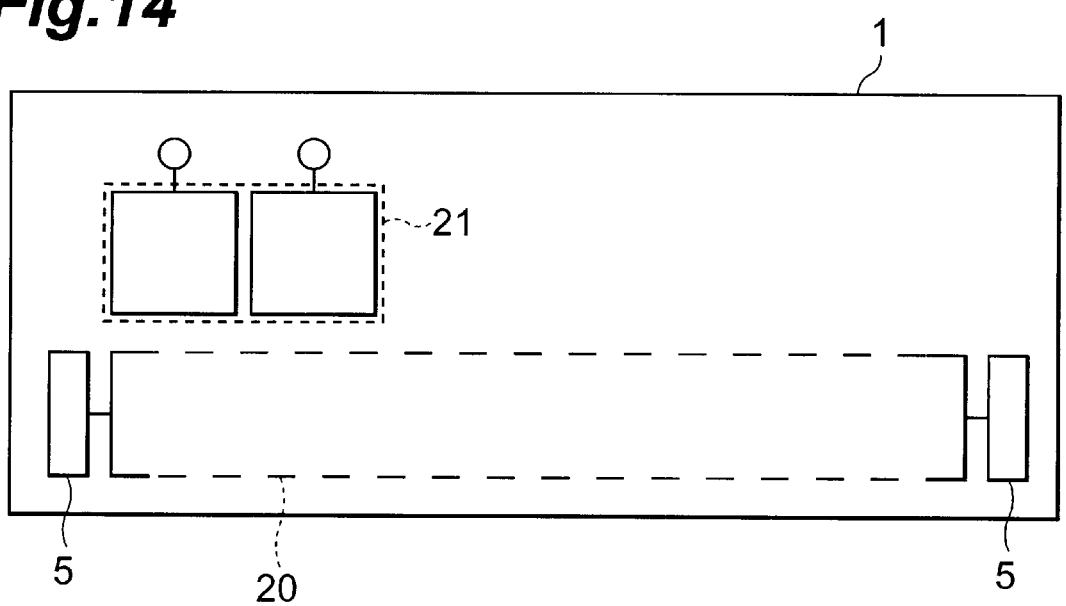
FIG. 14 is atop view of the conventional semiconductor position sensor.

FIG. 10 is a top view of the semiconductor position sensor according to the fourth embodiment, FIG. 11 is a cross-sectional view along I—I and in the arrow direction of the semiconductor position sensor illustrated in FIG. 10, FIG. 12 a cross-sectional view along II—II and in the arrow direction of the semiconductor position sensor illustrated in FIG. 10, and FIG. 13 a cross-sectional view along III—III and in the arrow direction of the semiconductor position sensor illustrated in FIG. 10. In the semiconductor position sensor of the second embodiment, as described previously, where the basic, conductive strip 2 and the high impurity concentration signal output semiconductor layers 4 were regarded as a semiconductor conductive strip, the gate means 10, 11 was provided approximately in the central part thereof.

The semiconductor position sensor of the present embodiment is different from the semiconductor position sensor of the second embodiment in that the position of the gate means 10, 11 is different from that illustrated in FIG. 4 to FIG. 6. The gate means 10, 11 of the present embodiment is provided near one end of the semiconductor conductive strip 2, 4, in other words, at the position where the current (carrier) taken out through the high impurity concentration signal output semiconductor layer 4 and the signal output electrode 5 is interrupted immediately before the signal output electrode 5. The semiconductor-position sensor functions as a PSD when the gate means 10, 11 enables the electric conduction between the two ends of the semiconductor conductive strip 2, 4, but it functions as a single PD when the gate means interrupts the electric conduction between them. This will be detailed below.

The semiconductor position sensor is provided with one basic, conductive strip 2 formed in the semiconductor substrate 1 and extending along the length direction X, a plurality of electroconductive branching strips 3 extending in the Y-direction from the basic, conductive strip 2, and a pair of high impurity concentration signal output semiconductor layers 4 connected to the two ends of the basic, conductive strip 2 and formed in the semiconductor substrate 1. One of the semiconductor layers 4 (on the right side in the figure) is divided so as to be discontinuous along the Y-direction and the gate electrode 11 is laid through the insulating film 10 on the division position.

Among the two regions of the semiconductor layer 4 thus divided, one region located on the side of basic, conductive strip 2 is referred to as a source-side high impurity concentration signal-output semiconductor layer 4-1, and the other region opposed through the gate electrode 11 as a drain-side high impurity concentration signal-output semiconductor layer 4-2. The border between the source-side semiconductor layer 4-1 and the drain-side semiconductor layer 4-2 constitutes the above division position and this division position is located immediately below the gate electrode 11 through the insulating film 10. In this embodiment, the semiconductor layer 17 for adjustment of the channel-forming potential is provided at this division position and it functions in the same manner as that in the second embodiment.

A current-bypass electrode 55, which conducts current from the right end of the basic, conductive strip 2 to immediately before the above division position, is disposed on the source-side semiconductor layer 4-1.

Namely, the resistivity of the current-bypass electrode 55 is sufficiently lower than that of the source-side semiconductor layer 4-1 and most of the current outputted from the right end of the basic, conductive strip 2 flows in the current-bypass electrode 55, without flowing in the source-side semiconductor layer 4-1.

Since the basic, conductive strip 2, branching strips 3, and high impurity concentration signal output semiconductor layer 4 are formed by the same impurity doping step, the resistivities thereof are equal. If they are made in separate steps so that the resistivity of the semiconductor layer 4 is sufficiently lower than that of the basic, conductive strip 2, the semiconductor layer 4 will function as the current-bypass electrode 55 does as to the conduction of current. Since the current-bypass electrode 55 in the present embodiment is made of an opaque material, it suppresses incidence of light to the semiconductor layer 4.

The gate electrode 11 is electrically connected to the bonding pad 11' on the passivation film 10 and, by applying a predetermined voltage through the bonding pad 11' to the gate electrode 11, it becomes feasible to control the channel formed in the semiconductor layer 17 for adjustment of the channel-forming potential at the above division position being the separation portion immediately below the gate electrode 11. When the zero or a negative voltage is given to the gate electrode 11, the conduction type of the channel is the p-type, electric conduction is established between the source-side semiconductor layer 4-1 and the drain-side semiconductor layer 4-2, and the semiconductor position sensor functions as a PSD similar to that of the second embodiment.

When a positive voltage over the predetermined value is given to the gate electrode 11 on the other hand, the p-type channel disappears and thus the electric conduction is interrupted between the source-side semiconductor layer 4-1 and the drain-side semiconductor layer 4-2, i.e., between the semiconductor layer 4 on the left side in the figure and the drain-side semiconductor layer 4-2. Then the semiconductor position sensor functions as a single PD.

When the semiconductor position sensor functions as a single PD and when the incident light falls on the photosensitive area in a state in which such a voltage as to apply the reverse bias voltage to the pn junction diodes composed of the p-type branching strips 3 and the n-type semiconductor substrate 1 is applied between the pair of signal output electrodes 5 and the back electrode 9, electron-hole pairs (charge) are created according to the incident light inside the semiconductor position sensor to diffuse and almost all of either electrons or holes flow according to the electric field inside the semiconductor position sensor, through the branching strips 3 and basic, conductive strip 2 into one semiconductor layer 4 (the left layer in the figure) to be taken out from the signal output electrode 5 provided thereon.

As described above, the semiconductor position sensor of the present embodiment is also the semiconductor position sensor in which the currents outputted from the two ends (the areas immediately below the electrodes 5, 5) of the semiconductor conductive strip consisting of the semiconductor layers 2, 4 vary according to positions of the incident light on the photosensitive area, the gate means 10, 11 capable of interrupting the electric conduction between the two ends is provided on the intermediate area of the semiconductor conductive strip, and almost all signal output can be obtained from one signal output electrode by providing the gate means in the region of the semiconductor layer 4. In other words, it becomes feasible to make the sensor function as a single PD.

As described above, the semiconductor position sensor does not have to include any PD separate from the PSD, whereby the device itself can be constructed in the small size. Further, since all signal light can impinge on the photosensitive area, the detection sensitivity can be improved.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor position sensor in which electric currents outputted from two ends of a semiconductor electroconductive area vary according to positions of incident light on a photosensitive area, wherein gate means capable of interrupting electric conduction between the two ends is provided on an intermediate area of said semiconductor electroconductive area, and wherein the position of said gate means is set so said semiconductor position sensor can function as a multiple-part split photodiode when said gate means interrupts the electrical connection between said two ends.

2. The semiconductor position sensor according to claim 1, wherein said gate means comprises an insulating film laid on said semiconductor electroconductive area, and a gate electrode laid on said insulating film.

3. The semiconductor position sensor according to claim 1, comprising a plurality of electroconductive branching strips extending from said semiconductor electroconductive area.

4. The semiconductor position sensor according to claim 3, wherein a resistivity of said branching strips is substantially equal to that of said semiconductor electroconductive area.

5. The semiconductor position sensor according to claim 2, wherein said semiconductor electroconductive area immediately below said gate electrode has an impurity concentration different from that of said two ends.

6. The semiconductor position sensor according to claim 1, wherein said gate means comprises an insulating film laid on said semiconductor electroconductive area, and a plurality of gate electrodes laid each on said insulating film.

7. A semiconductor position sensor in which electric currents outputted from two ends of a semiconductor electroconductive area vary according to positions of incident light on a photosensitive area, wherein gate means capable of interrupting electric conduction between the two ends is provided on an intermediate area of said semiconductor electroconductive area, the semiconductor position sensor comprising a plurality of electroconductive branching strips extending from said semiconductor electroconductive area.

8. The semiconductor position sensor according to claim 7, wherein a resistivity of said branching strips is substantially equal to that of said semiconductor electroconductive area.

9. A semiconductor position sensor in which electric currents outputted from two ends of a semiconductor electroconductive area vary according to positions of incident light on a photosensitive area, wherein gate means capable of interrupting electric conduction between the two ends is provided on an intermediate area of said semiconductor electroconductive area, wherein said gate means comprises an insulating film laid on said semiconductor electroconductive area, and a gate electrode laid on said insulating film, and wherein said semiconductor electroconductive area immediately below said gate electrode has an impurity concentration different from that of said two ends.

10. A semiconductor position sensor comprising:

a semiconductor electroconductive area having a plurality of ends from which electric currents are outputted, wherein the electric currents outputted from the ends of the semiconductor electroconductive area vary according to positions of incident light on a photosensitive area; and a gate, capable of interrupting electrical conduction between the ends of the semiconductor electroconductive area, and provided on an intermediate area of the semiconductor electroconductive area, wherein the gate is positioned such that the semiconductor position sensor is configured as a multiple-part split photodiode when the gate interrupts the electrical conduction between the ends of the semiconductor electroconductive area.

11. The semiconductor position sensor according to claim 10, wherein the gate is positioned such that the semiconductor position sensor is configured as a position sensitive detector (PSD) when the gate does not interrupt the electrical conduction between the ends of the semiconductor electroconductive area.

* * * * *